United States Patent [19]

Isogai et al.

[11] Patent Number: 4,625,299

[45] Date of Patent: Nov. 25, 1986

[54] BIPOLAR RANDOM ACCESS MEMORY

[75] Inventors: Hideaki Isogai, Higashikurume; Isao Fukushi, Yokohama, both of Japan

[73] Assignee: Fujitsu Limited, Kawasaki, Japan

[21] Appl. No.: 573,610

[22] Filed: Jan. 25, 1984

[30] Foreign Application Priority Data

Jan. 31, 1983 [JP] Japan ................. 58-014057

[51] Int. Cl.$^4$ ............................. G11C 7/00
[52] U.S. Cl. .................. 365/189; 365/190; 365/155
[58] Field of Search ............. 365/190, 155, 179, 189

[56] References Cited

U.S. PATENT DOCUMENTS

| 4,272,811 | 6/1981 | Wong | 365/190 |
|---|---|---|---|
| 4,459,686 | 7/1984 | Toyoda | 365/190 |
| 4,464,735 | 8/1984 | Toyoda et al. | 365/155 |

OTHER PUBLICATIONS

IEEE International Solid-State Circuits Conf., Feb. 15, 1979, NY (U.S.), U. Buerker et al.: "An ECL 100K Compatible 1024×4b RAM with 15 ns Access Time", pp. 102–103.
Patents Abstract of Japan, vol. 4, Nr. 172 (p-38)(654), Nov. 27, 1980; and JP-A-55 117 790 (Hitachi Seisakusho K.K.) 10-09-80.

Primary Examiner—Terrell W. Fears
Assistant Examiner—Guy M. Miller
Attorney, Agent, or Firm—Staas & Halsey

[57] ABSTRACT

A semiconductor memory device used as a bipolar random access memory including a plurality of pairs of word lines, a plurality of pairs of bit lines, and a plurality of static memory cells located at the intersections of and connected between the pairs of word and bit lines. A plurality of constant current sources are selectively connected to the bit lines. A reading-writing voltage control circuit controls the potential of each bit line during the reading and writing of data and a writing current control circuit controls the current flowing to each bit line during the writing of data into the memory cell. Further, the writing current control circuit connects the constant current source to the reading-writing voltage control circuit in the writing of data to the memory cell. Accordingly, the bipolar random access memory can operate at a high speed with reduced power consumption and without unnecessary current flowing in the peripheral circuits.

4 Claims, 5 Drawing Figures

BIPOLAR RANDOM ACCESS MEMORY

BACKGROUND OF THE INVENTION

1. Field of the Invention

The present invention relates to a semiconductor memory device, more particularly, to a bipolar random access memory (bipolar RAM) using an emitter-coupled-logic (ECL) memory cell and peripheral circuits, which can operate on greatly reduced power consumption in both writing and reading operations.

2. Description of the Prior Art

Bipolar RAM's generally comprise an ECL memory cell, consisting of a flip-flop circuit constructed by a pair of multi-emitter transistors and electric elements, and a plurlaity of peripheral circuits for controlling the writing on reading operation in the memory cell.

Although bipolar RAM's can be used under high-speed operation, such high-speed operation entails a large current flow in the memory cell and the peripheral circuits. As a result, biploar RAM's consume large amounts of power. The higher the speed of the writing and reading operation, the greater the power consumption of the bipolar RAM. In this regard, it should be noted that a large unnecessary current flows to the peripheral circuits, particularly during the writing operation.

SUMMARY OF THE INVENTION

The object of the present invention is to provide a bipolar RAM, using an ECL memory cell and a plurlaity of peripheral circuits, which can operate at a high speed with greatly reduced power consumption and without unnecessary current flowing in the peripheral circuits.

In accordance with the present invention, there is provided a semiconductor memory device used as a bipolar RAM comprising: a plurality of pairs of word lines; a plurlity of pairs of bit lines; a plurality of static memory cells, each static memory cell connected between a pair of work lines and a pair of bit lines at the being intersection of a pair of word lines and a pair of bit lines; selecting means, operatively connected to said bit lines, for selectively connecting to the bit lines a plurality of constant current sources, operatively connected to the selecting means; a reading-writing voltage control circuit, operatively connected to the bit lines, for controlling the potential of each bit line during the reading and writing of data; and a writing current control circuit, operatively connected to the constant current source, for controlling the current flowing to each bit line in the writing of data to the memory cell. The writing current control circuit operatively connects the constant current source to the reading-writing voltage control circuit during the writing of data in the memory cell.

In accordance with the structure of the present invention, it is possible to greatly reduce the power consumption of a bipolar RAM using an ECL memory cell and a plurality of the peripheral circuits without reducing the operation speed as compared with a conventional bipolar RAM.

DESCRIPTION OF THE PREFERRED EMBODIMENTS

Before describing the preferred embodiments of the present invention, a detailed explanation is given of a prior art circuit as background.

Figure 1:
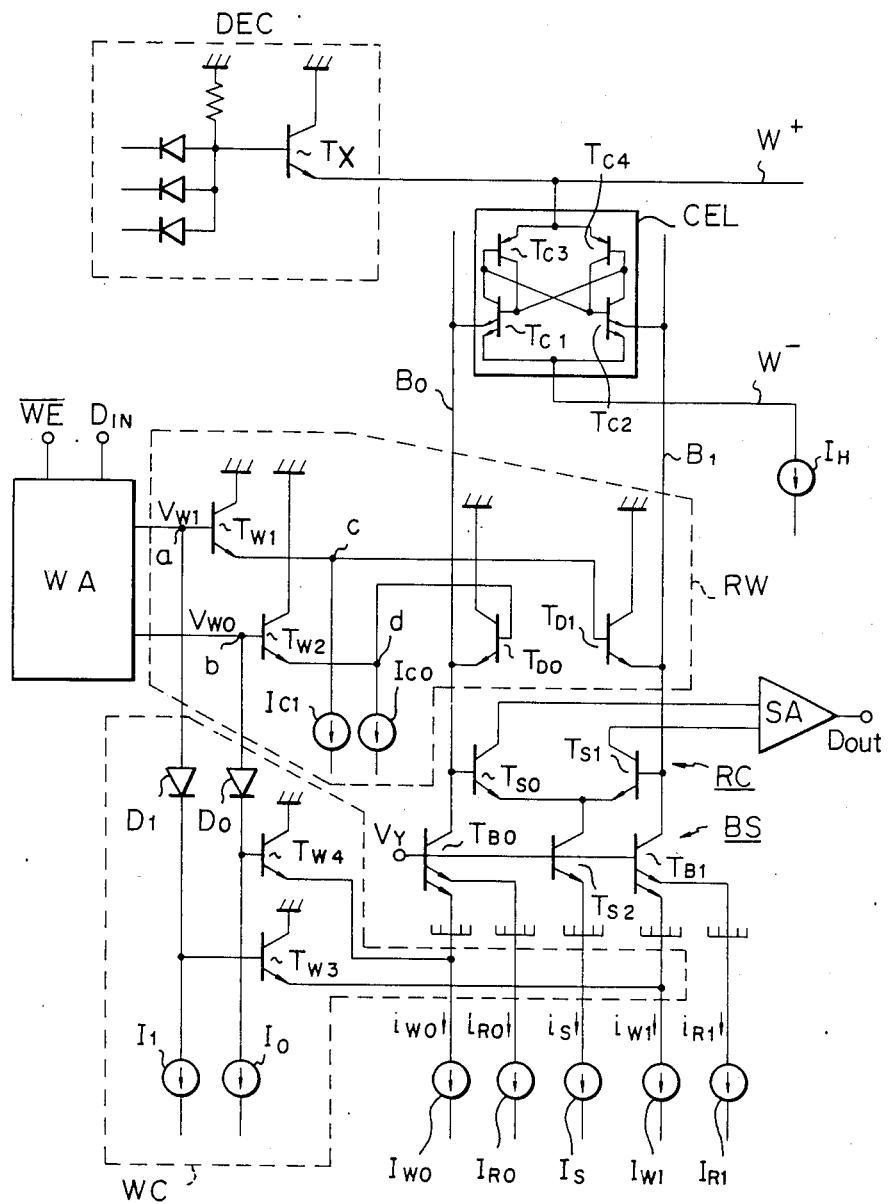
FIG. 1 is a basic circuit diagram of a conventional bipolar RAM.

A prior art bipolar RAM is shown in FIG. 1. Referring to FIG. 1, the bipolar RAM comprises a decoder circuit DEC, a writing amplifier WA, a reading-writing voltage control circuit RW, a writing current control circuit WC, a reading circuit RC, a bit line selecting circuit BS, a plurality of constant current sources $I_{W0}$, $I_{W1}$, $I_S$, $I_{R0}$, $I_{R1}$, $I_{C0}$, $I_{C1}$, $I_0$, $I_1$, and $I_H$, and an ECL memory cell CEL.

The memory cell CEL is connected between a positive work line $W+$ and a negative work line $W-$ and between a bit line $B_0$ and a bit line $B_1$. The memory cell CEL also comprises a pair of NPN transistors $T_{C1}$ and $T_{C2}$, constituting a flip-flop circuit, and a pair of PNP transistors $T_{C3}$ and $T_4$, used as a load. The positive word line $W+$ is connected to the decoder circuit DEC having a word-driver transistor $T_X$. The negative work line $W-$ is connected to a holding constant current source $I_H$.

A writing command signal $\overline{WE}$ and a writing data $D_{IN}$ are provided to the writing amplifier WA. When the signal $\overline{WE}$ is set to a low level, the output voltages $V_{W0}$ and $V_{W1}$ (at points "a" and "b") of the amplifier WA are set alternatley to a high level and a low level corresponding to the input writing data $D_{IN}$. Meanwhile, when the signal $\overline{WE}$ is set to a high level, the output voltages $V_{W0}$ and $V_{W1}$ of the amplifier WA are set to a middle voltage level beteen the high level and the low level, which are obtained from the output voltage of WA when $\overline{WE}$ is set to a low level.

The reading-writing voltage control circuit RW comprises two transistors $T_{W1}$ and $T_{W2}$, the bases of which receive output voltages $V_{W1}$ and $V_{W0}$, respectively, the constant current sources $I_{C0}$ and $I_{C1}$, and a pair of transistors $T_{D0}$ and $T_{D1}$, the emitters of which are connected to the bit lines $B_0$ and $B_1$, respectively. The control circuit RW can control the potential of each of bit lines $B_0$ and $B_1$ corresponding to the writing command signal $\overline{WE}$ and the writing data $D_{IN}$.

The writing current control circuit WC comprises two diodes $D_0$ and $D_1$, for shifting a voltage level, two transistors $T_{W3}$ and $T_{W4}$, and two constant current sources $I_0$ and $I_1$. The control circuit WC can control writing current flowing to the selected bit lines $B_0$, $B_1$ in writing data into the memory cell CEL.

The reading circuit RC comprises a pair of transistors $T_{S0}$ and $T_{S1}$, the bases of which are connected to the bit lines $B_0$ and $B_1$, respectively, and sense amplifier SA which detects and amplifies the data which is read out on the bit lines $B_0$ and $B_1$, and provides the output data $D_{out}$.

The bit selecting circuit BS comprises two multi-emitter transistors $T_{B0}$ and $T_{B1}$, the collectors of which are connected to the bit lines $B_0$ and $B_1$, respectively. A column selecting signal $V_Y$ is applied to the bases of these transistors. The first emitters of the transistors $T_{B0}$ and $T_{B1}$ are respectively connected to constant current sources $I_{W0}$ and $I_{W1}$ for writing in common with the first emitters of the transistors of other bit selecting circuit (c.f, FIG. 4) connected to other bit lines (c.f, FIG. 4). The second emitters of the transistors $T_{B0}$ and $T_{B1}$ are respectively connected to constant current sources $I_{R0}$ and $I_{R1}$ for reading in common with the second emitters of the transistors of the same other circuits. A transistor $T_{S2}$, the base of which receives the column selecting signal $V_Y$, is connected to a common node of the emitters of the transistors $T_{S0}$ and $T_{S1}$ and to the constant current source $I_S$ via its emitter in common with the emitters of the transistors of other similar circuits.

Figure 2:
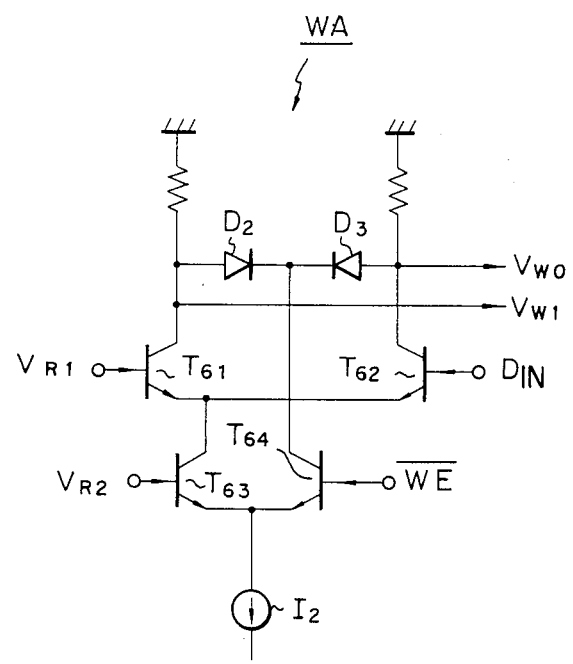
FIG. 2 is a basic circuit diagram of a writing amplifier shown in FIG. 1.

FIG. 2 is a basic circuit diagram of a writing amplifier shown in FIG. 1.

The writing amplifier WA comprises two pairs of the transistors $T_{61}$ and $T_{62}$ and $T_{63}$ and $T_{64}$, a pair of the diodes $D_2$ and $D_3$, and a constant current source $I_2$. The reference voltages $V_{R1}$ and $V_{R2}$ are applied to the bases of the transistors $T_{61}$ and $T_{63}$, respectively; the writing command signal $\overline{WE}$ is applied to the base of the transistor $T_{64}$; and the writing data $D_{IN}$ is applied to the base of the transistor $T_{62}$. The output voltages $V_{W0}$ and $V_{W1}$ are provided from the collectors of the transistors $T_{61}$ and $T_{62}$, respectively.

This conventional writing amplifer WA is disclosed in Japanese Examined Patent Publication (Kokoku) No. 57-11178, assigned to Fujitsu Limited. A detailed explanation regarding the operation is therefore omitted.

As is clear from the above, a conventional bipolar RAM requires many constant current sources, such as $I_{C0}$, $I_{C1}$, $I_0$, $I_1$, $I_{W0}$, $I_{W1}$, $I_{R0}$, $I_{R1}$, and $I_S$. In the writing operation of the reading-writing circuit RW, however, either the constant current source $I_{W0}$ or $I_{W1}$ consumes unnecessary current since the writing current $i_{W0}$ and $i_{W1}$ is only applied to one side of the bit line $B_0$ or $B_1$.

Moreover, in the writing operation of the reading-writing circuit RW, it is necessary that one base potential become high and the othe base potential become low in order to invert the state of the memory cell of a pair of transistors, for example, $T_{C1}$ and $T_{D0}$ or $T_{C2}$ and $T_{D1}$. Accordingly, in order to reduce the base potential of one side, an independent current source ($I_{C0}$ or $I_{C1}$) becomes necessary.

In accordance with the present invention, the independent current source ($I_{C0}$ or $I_{C1}$) mentioned above is eliminated from the reading-writing circuit RW. Instead, the unnecessary current, i.e., the writing current of the side controlled by the writing current control circuit WC, is utilized for controlling the base potential of either the transistor $T_{D0}$ or $T_{D1}$.

A bipolar RAM according to an embodiment of the present invention will now be described.

Figure 3:
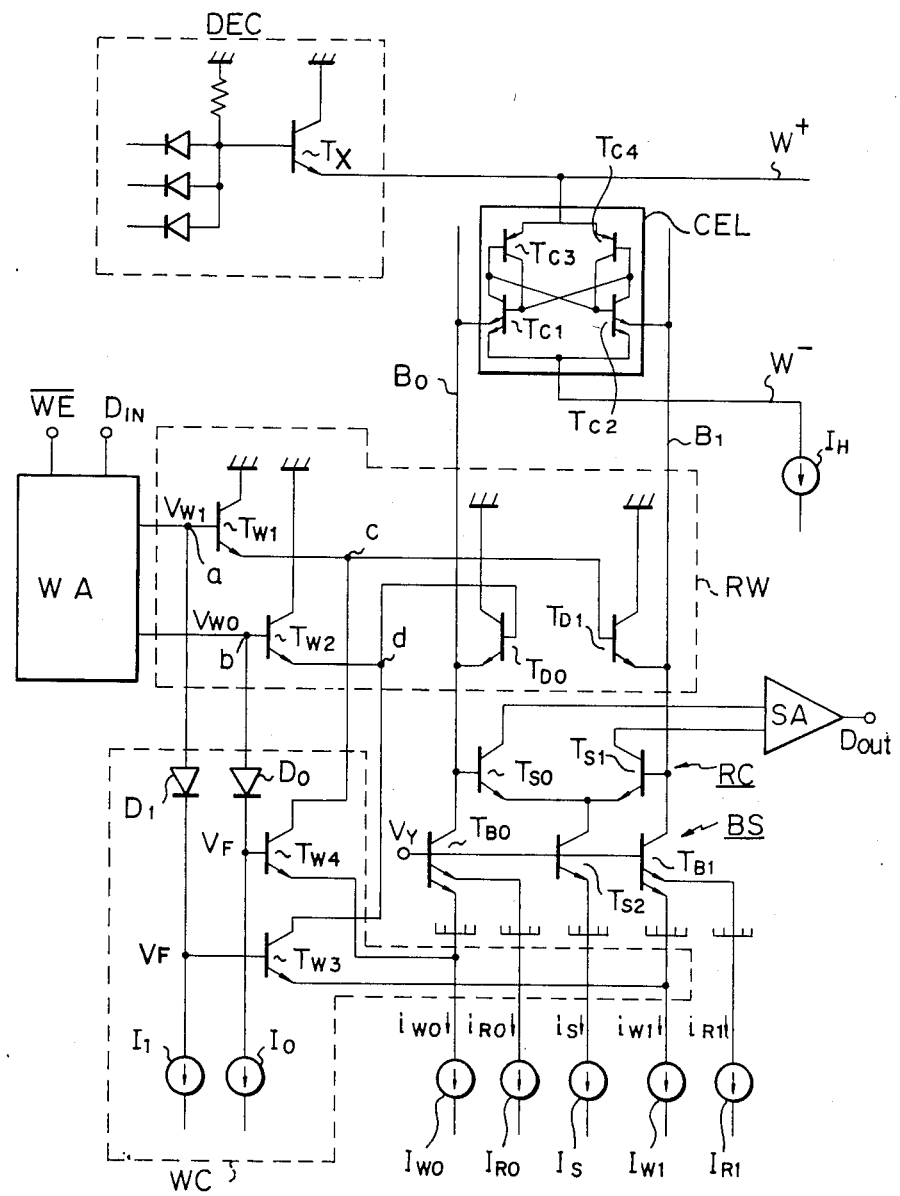
FIG. 3 is a basic circuit diagram of a bipolar RAM according to an embodiment of the present invention.

Referring to FIG. 3, the bipolar RAM comprises a decoder circuit DEC, a writing amplifier WA, a reading-writing voltage control circuit RW, a writing current control circuit WC, a reading circuit RC, a bit selecting circuit BS, a plurality of constant current sources $I_0$, $I_1$, $I_{W0}$, $I_{W1}$, $I_{R0}$, $I_{R1}$, $I_S$, and $I_H$, and an ECL memory cell CEL.

As with FIG. 1, the memory cell CEL is connected between a positive word line $W^+$ and a negative word line $W^-$ and between a bit line $B_0$ and a bit line $B_1$. The memory cell CEL also comprises a pair of NPN transistors $T_{C1}$ and $T_{C2}$ constituting a flip-flop circuit and a pair of PNP transistors $T_{C3}$ and $T_{C4}$ used as a load. The positive word line $W^+$ is connected to the decoder circuit DEC having a word-driver transistor $T_X$. The negative word line $W^-$ is connected to a holding constant current source $I_H$. A writing command signal $\overline{WE}$ and a writing data $D_{IN}$ are applied to the writing amplifier WA. When the signal $\overline{WE}$ is set to a low level, the output voltages $V_{W0}$ and $V_{W1}$ (at points "a" and "b") of the amplifier WA are set alternately to a high level and a low level corresponding to the input writing data $D_{IN}$. Meanwhile, when the signal $\overline{WE}$ is set to a high level, the output voltages $V_{W0}$ and $V_{W1}$ of the amplifier WA are set to a middle voltage level between the high level and the low level, which are obtained from the output voltage of WA when $\overline{WE}$ is set to a low level.

The reading-writing voltage control circuit RW comprises two transistors $T_{W1}$ and $T_{W2}$, the bases of which receive output voltages $V_{W1}$ and $V_{W0}$, respectively, and a pair of transistors $T_{D0}$ and $T_{D1}$, the emitters of which are connected to the bit lines $B_0$, $B_1$, respectively. The control circuit RW can control the potential of each bit line $B_0$, $B_1$ corresponding to the writing command signal $\overline{WE}$ and the writing data $D_{IN}$.

The writing current control circuit WC comprises two diodes $D_0$ and $D_1$ for shifting a voltage level, two transistros $T_{W3}$ and $T_{W4}$, and two constant current sources $I_0$ and $I_1$. The control circuit WC can control the writing current flowing to the bit lines $B_0$ and $B_1$ during the writing of the data into the memory cell CEL.

The reading circuit RC comprises a pair of transistors $T_{S0}$ and $T_{S1}$, the bases of which are connected to the bit lines $B_0$ and $B_1$, respectively and a sense amplifier SA which detects and amplifies the data which is read out on the bit lines $B_0$ and $B_1$ and provides the output data $D_{out}$.

The bit line selecting circuit BS comprises two multi-emitter transistors $T_{B0}$ and $T_{B1}$, the collectors of which are connected to the bit lines $B_0$ and $B_1$, respectively. A column selecting signal $V_y$ is applied to the bases of these transistors. The first emitters of the transistors $T_{B0}$ and $T_{B1}$ are respectively connected to the constant current sources $I_{W0}$ and $I_{W1}$ for writing in common with the first emitters of the transistors of other bit selecting circuits (c.f, FIG. 4) connected to other bit lines (c.f, FIG. 4). The second emitters of the transistors $T_{B0}$ and $T_{B1}$ are respectively connected to the constant current sources $I_{R0}$ and $I_{R1}$ for reading in common with the second emitters of the transistors of other similar circuits. A trasistor $T_{S2}$, the base of which receives the column selecting signal $V_y$, is connected to a common node of the emitters of transistors $T_{S0}$ and $T_{S1}$ and to the constant current sources $I_S$ via its emitter in common with the emitters of the transistors of other similar circuits.

Next, the operation of the bipolar RAM according to the embodiment of the present invention will be explained in detail.

Figure 4:
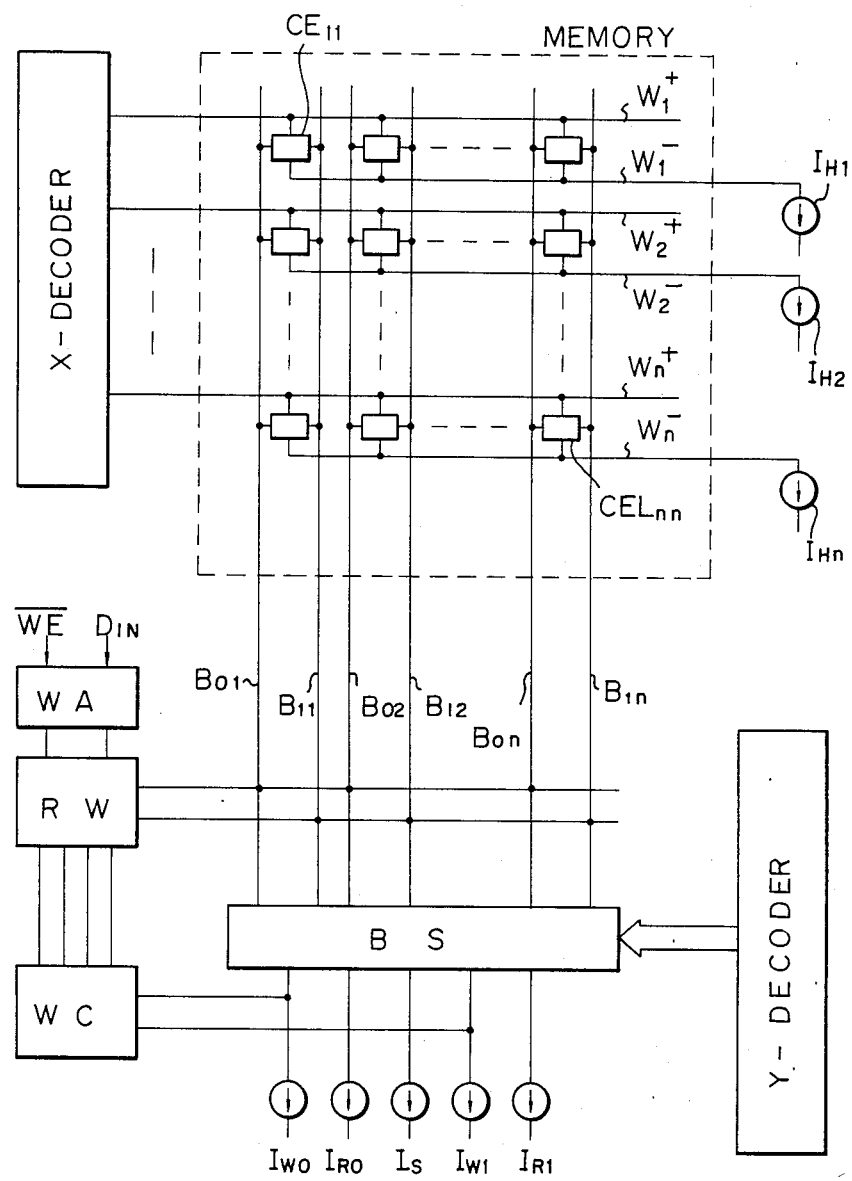
FIG. 4 is a block diagram of the overall structure of the bipolar RAM shown in FIGS. 3 and 5.

In the reading operation, when the writing command signal $\overline{WE}$ is set to a high level, the correlation of the output voltages $V_{W0}$ and $V_{W1}$ of the writing amplifier WA, the forward direction voltage drop $V_F$ of the diodes $D_0$ and $D_1$, and the column selecting signal voltage $V_y$ applied by the Y-decoder (c.f. FIG. 4) are previously set according to the formula $V_{W0}(=V_{W1})-V_F>V_Y$, where the output voltage $V_{W0}$ is equal to the output voltage $V_{W1}$.

Since the transistors $T_{W3}$ and $T_{B1}$ and the transistors $T_{W4}$ and $T_{B0}$ constitute so-called current switching circuits, the current flows from the higher side base voltage level of the transistor. Accordingly, since no large current is necessary for the bit lines $B_0$ and $B_1$ in the reading operation, the base potentials of the transistors $T_{W3}$ and $T_{W4}$ are set to a higher base potential than the potential of $V_Y$. Consequently, since the base level of the transistor $T_{W3}$ is higher than that of the transistor $T_{B1}$ and the base level of the transistor $T_{W4}$ is higher than that of the transistor $T_{B0}$, the current $i_{W0}$ flowing to the constant current source $I_{W0}$ flows through the transistor $T_{W4}$, and the current $i_{W1}$ flowing to the constant current source $I_{W1}$ flows through the transistor $T_{W3}$. Accordingly, no large current flows through the transistors $T_{B0}$ and $T_{B1}$.

The potential corresponding to the output voltage $V_{W0}$ ($=V_{W1}$) minus the base-emitter voltage $V_{BE}$ (at points "c" and "d") of the transistors $T_{W1}$, $T_{W2}$ is set to the middle voltage level between the base potential and the collector potential of the transistors $T_{C1}$ and $T_{C2}$, constituting the flip-flop circuit in the memory cell CEL. Moreover, the transistors $T_{D0}$ and $T_{D1}$ and the transistors $T_{C1}$, $T_{C2}$ in the memory cell CEL both constitute current switching circuits. When the transistor $T_{C1}$ turns on, i.e., the base potential of transistor $T_{C1}$ is higher than that of transistor $T_{D0}$, the potential of the bit line $B_0$ is determined by transistor $T_{C1}$ in the memory cell CEL. Meanwhile, the potential of the bit line $B_1$ is determined by the output voltage $V_{W1}$. Accordingly, a potential occurs between the bit line $B_0$ and the bit line $B_1$.

The potential between the bit line $B_0$ and the bit line $B_1$ is detected by the switching circuit, which consists of the transistors $T_{S0}$, $T_{S1}$, $T_{S2}$ and the constant current souce $I_S$, and is provided from the sense amplifier SA as the output data $D_{out}$.

At this time, the current flowing from the memory cell CEL to the bit line $B_0$ is represented by the current $i_{R0}$ which flows to the current source $I_{R0}$, since both currents $i_{R0}$, $i_{R1}$ are determined by the condition; $i_{R0}$ and $i_{R1} < i_{W0}$ and $i_{W1}$, in the reading operation. Therefore, it is possible to make the current flowing in the memory cell small compared with the current flowing in the writing operation.

Consequently, it is possible to make the charge accumulation effect small at the base area of the PNP-type load transistors in the memory cell CEL, whereby it is possible to quickly write the writing data in the memory cell CEL, as explained below in detail.

The writing operation in the case where the transistor $T_{C2}$ in the memory cell CEL turns on will now be explained. When the writing command signal $\overline{WE}$ is set to a low level, and the input data $D_{IN}$ is set to a low level, the output voltages $V_{W0}$, $V_{W1}$ are selected so as to satisfy the formula; $V_{W1} - V_F < V_Y < V_{W0} - V_F$, where $V_{W0}$ and $V_{W1}$ are the output voltages (at points "a" and "b") of the writing amplifier WA, $V_F$ is the forward direction voltage drop of the diodes $D_0$ and $D_1$, and $V_Y$ is the column selecting signal voltage.

Accordingly, the current flowing to the constant current source $I_{W1}$ flows through the bit line $B_1$ via the transistor $T_{B1}$. Moreover, since the base potential of the transistor $T_{D1}$ is lower than that of the cell transistor $T_{C2}$, the cell transistor $T_{C2}$ turns on according to the current switching circuit function. On the other hand, since the base potenital of the transistor $T_{D0}$ is higher than that of the cell transistor $T_{C1}$, the cell transistor $T_{C1}$ turns off. Consequently, since the large writing current flows through the transistor $T_{C2}$ in the memory cell CEL and since a small current is set to flow through the transistor $T_{C2}$ in the reading operation so as to make the charge accumulation small, as mentioned above, the memory cell CEL can operate quickly in the writing operation.

Meanwhile, regarding the bit line $B_0$, since the current $i_{W0}$ flows to the constant current source $I_{W0}$ through the transistor $T_{W4}$, the current $i_{R0}$ flows only through the bit line $B_0$. However, since this current $i_{R0}$ flows from the transistor $T_{D0}$, which turns on by the higher potential $V_{W0}$, the current $i_{R0}$ does not flow through the transistor $R_{C1}$ in the memory cell CEL.

As mentioned above, in the reading operation, a small current is set to flow through the transistor which turns on in the memory cell so as to make the charge accumulation effect small. Meanwhile, in the writing operation, the large writing current flows through the transistor which becomes in a turn-on state in the memory cell. Accordingly, as explained above, the memory cell can operate quickly in the writing operation based on the two operation procedures.

As can be seen from the drawings, the difference between the present invention and the prior art lies in the connection of the base of the transistor $T_{D0}$ to the collector of the transistor $T_{W3}$ and the connection of the base of the transistor $T_{D1}$ to the collector of the transistor $T_{W4}$ in the reading-writing voltage control circuit RW. Accordingly, the constant current sources $I_{C0}$ and $I_{C1}$ (FIG. 1) are eliminated from the reading-writing voltage control circuit RW. Instead, the unnecessary current i.e., one of the writing currents $i_{W0}$, $i_{W1}$, is utilized for controlling the base potential of one of the transistors $T_{D0}$ or $T_{D1}$ by connecting one of the current sources $I_{W0}$ and $I_{W1}$ to the base of one of the transistors $T_{D0}$ or $T_{D1}$ through one of the transistors $T_{W4}$ or $T_{W3}$. Accordingly, a part of the conventional base charge flowing from the base of the transistors $T_{D0}$ and $T_{D1}$ through the current sources $I_{C0}$ and $I_{C1}$ as shown in FIG. 1 flows to the constant current sources $I_{W0}$ and $I_{W1}$ through the transistors $T_{W3}$ and $T_{W4}$, according to the present invention.

Consequently, it is possible to greatly reduce the power consumption of a bipolar RAM according to the present invention.

FIG. 4 is a block diagram of the overall structure of the bipolar RAM shown in FIG. 3. Referring to FIG. 4, the memory is constituted by a plurality of static memory cells $CEL_{11}$ to $CEL_{nn}$. Each memory cell is connected to one of the work line paris $W_1^+$, $W_1^-$ to $W_n^+$, $W_n^-$, and to one of the bit line pairs $B_{01}$, $B_{1n}$ to $B_{0n}$, $B_{1n}$. Each of word lines $W_1^+$ to $W_n^+$ is connected to an X-decoder, and each of word lines $W_1^-$ to $W_n^-$ is connected to one of the constant current sources $I_{H1}$ to $I_{Hn}$. Each bit line of the paris $B_{01}$, $B_{11}$ to $B_{0n}$, $B_{1n}$ is connected to the reading-writing voltage control circuit RW and to the bit selecting circuit BS. The bit selecting circuit BS is connected to the Y-decoder. Each output of the bit line selecting circuit BS is connected to the constant current sources $I_{W0}$, $I_{B0}$, $I_S$, $I_{W1}$, and $I_{R1}$, respectively. Therefore, these constant current sources $I_{W0}$, $I_{R0}$, $I_S$, $I_{W1}$, $T_{R1}$ and $I_{R1}$ are supplied to only one pair of bit lines which is selected by the bit line selecting circuit BS. As shown in FIG. 3, however, each output of the writing current control circuit WC is connected to one of current sources $I_{W0}$ and $I_{W1}$ in common with each first emitter of the transistors $T_{B0}$ and $T_{B1}$ constituting the bit line selecting circuit BS.

Since detailed explanations have already been given in regard to FIG. 3, they will be omitted here.

Figure 5:
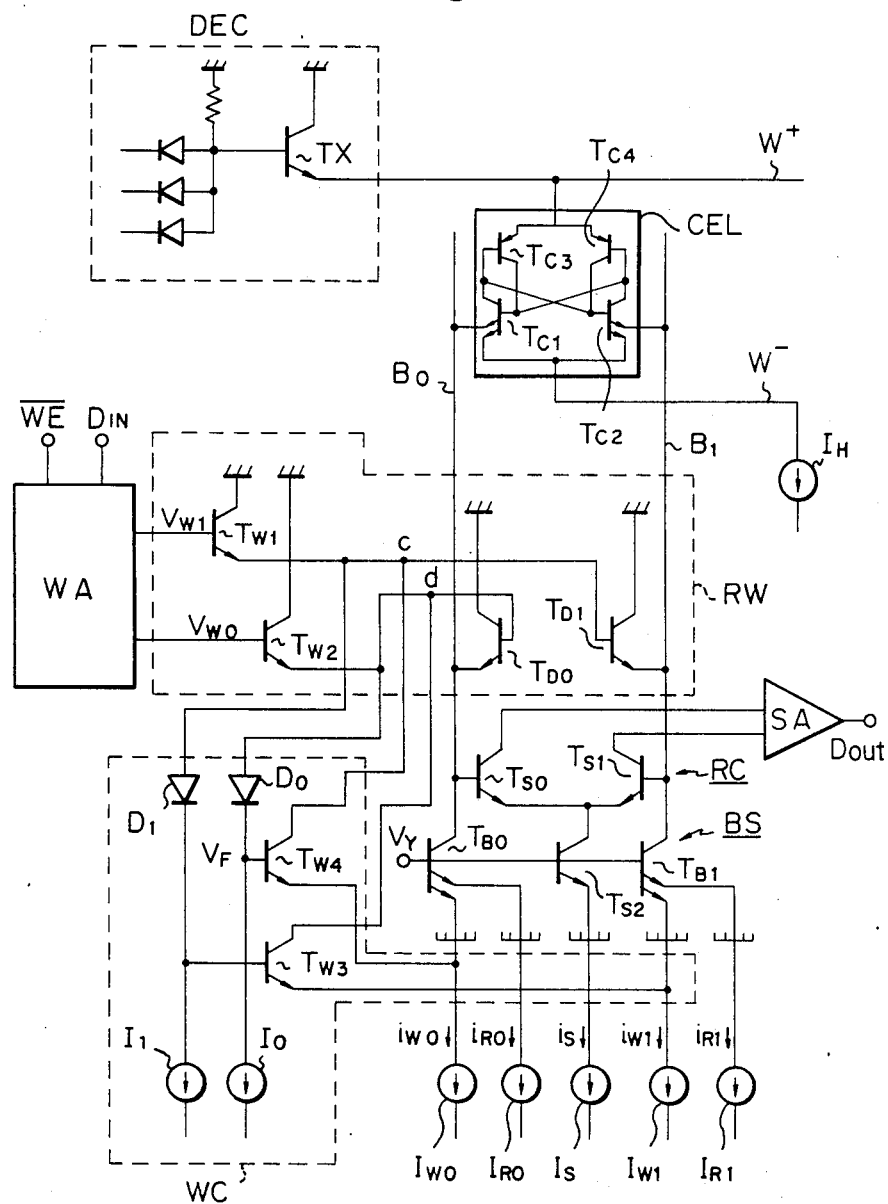
FIG. 5 is a basic circuit diagram of a bipolar RAM according to another embodiment of the present invention.

FIG. 5 shows another embodiment, which is almost the same as the circuit in FIG. 3, except for the connection of the diodes $D_1$ and $D_0$. That is, unlike the circuit in FIG. 3, in which the anodes of the diodes $D_0$ and $D_1$ are connected to the bases of the transistors $T_{W1}$ and $T_{W2}$, in this embodiment, FIG. 5, the anodes of the diodes $D_0$, $D_1$ are connected to the emitters of the transistors $T_{W1}$ and $T_{W2}$, respectively.

We claim:

1. A bipolar random access memory device, comprising:
    a plurality of pairs of word lines;
    a plurality of pairs of bit lines, said word lines and said bit lines intersecting at a plurality of intersections;
    a plurality of static memory cells, each static memory cell being connected between a pair of word lines and a pair of bit lines at a corresponding one of the intersections;
    means, operatively connected to said bit lines, for selecting the bit lines;
    a plurality of constant current sources operatively connected to said selecting means;
    a reading-writing voltage control circuit, comprising a pair of firt transistors, an emitter of one of the first transistors being connected to one bit line of the pair of bit lines and an emitter of the other one of the first transistors being connected to the other one bit line of the pair of bit lines, for controlling the potential of each of said bit lines during the reading and writing of data; and
    a writing current control circuit comprising a pair of second transistors, an emitter of each of the second transistors being connected to the constant current sources, for selectively, operatively connecting respective ones of said constant current sources to the base of respective ones of the first transistors during the writing of data into said memory cell and for controlling the current flowing to each of each bit lines during the writing of data into said memory cell.

2. A semiconductor memory device as claimed in claim 1, wherein:
    said selecting means comprises a pair of third transistors, the emitters of the third transistors being connected to the constant current sources, respectively, the collectors of the third transistors bieng connected to the bit lines, selectively, and
    the second and third transistors operate as current switching circuits.

3. A semiconductor memory device as claimed in claim 1, wherein said memory cell comprises a pair of cell transistors, each transistor having a pair of emitters, one emitter of each cell transistor being connected to one bit line of the pair of bit lines and the other emitter of each cell transistor being connected to one word line of the pair of word lines and wherein the first transistors and cell transistors operate as current switching circuits.

4. A semiconductor memory device as claimed in claim 2, further comprising
    a write amplifier, connected to the reading-writing voltage control circuit and the writting current control circuit, for receiving a writing command signal and an input data and for supplying an output voltage to the reading-writing voltage control circuit and the writing current control circuit.

* * * * *

UNITED STATES PATENT AND TRADEMARK OFFICE
CERTIFICATE OF CORRECTION

PATENT NO. : 4,625,299                               PAGE 1 of 2

DATED : November 25, 1986

INVENTOR(S) : Isogai et al.

It is certified that error appears in the above-identified patent and that said Letters Patent is hereby corrected as shown below:

Col. 1,   line 17, "on" should be --or--;
          line 33, "laity" should be --ality--;
          line 40, "plurlity" should be --plurality--;
          line 42, "work" should be --word--;
          line 43, delete "being".

Col. 2,   line 25, "work" should be --word--;
          line 25, "W+" should be $--W^+--$;
          line 25, "W-" should be $--W^---$;
          line 29, "$T_4$," should be $--T_{C4}--$;
          line 31, "work" should be --word--;
          line 32, "W-" should be $--W^---$;
          line 38, "alternatley" should be --alternately--;
          line 42, "beteen" should be --between--;
          line 62, "and sense" should be --and a sense--.

Col. 3,   line 42, "othe" should be --other--;
          line 65, "W+" should be $--W^+--$;
          line 66, "W-" should be $--W^---$.

UNITED STATES PATENT AND TRADEMARK OFFICE
CERTIFICATE OF CORRECTION

PATENT NO. : 4,625,299

DATED : November 25, 1986

INVENTOR(S) : Isogai et al.

It is certified that error appears in the above-identified patent and that said Letters Patent is hereby corrected as shown below:

Col. 4, line 2, "W+" should be --$W^+$--;
line 4, "W-" should be --$W^-$--;
line 41, "$V_y$ should be --$V_Y$--;
line 51, "trasistor" should be --transistor--;
line 52, "$V_y$" should be --$V_Y$--;
line 65, "$V_y$" should be --$V_Y$--.

Col. 6, line 14, "$R_{C1}$" should be --$T_{C1}$--;
line 52, "paris $W_1+$, $W_1-$ to $W_n+$," should be --pairs $W_1^+$, $W_1^-$ to $W_n^+$,--;
line 53, "$W_n-$" should be --$W_n^-$--;
line 54, "$W_1+$ to $W_n+$" should be --$W_1^+$ to $W_n^+$--;
line 55, "$W_1-$ to $W_n-$" should be --$W_1^-$ to $W_n^-$--;
line 57, "paris" should be --pairs--;
line 64, delete "$T_{R1}$".

Col. 7, line 28, "firs" should be --first--.

Col. 8, line 15, "bieng" should be --being--;
line 31, "writting" should be --writing--.

Signed and Sealed this

Twenty-eighth Day of April, 1987

Attest:

DONALD J. QUIGG

Attesting Officer

Commissioner of Patents and Trademarks